United States Patent [19]
Sigmon

[11] Patent Number: 5,103,194
[45] Date of Patent: Apr. 7, 1992

[54] DIELECTRIC RESONATOR FEED BACK STABILIZER

[75] Inventor: Bernard E. Sigmon, Tempe, Ariz.
[73] Assignee: Motorola, Inc., Schaumburg, Ill.
[21] Appl. No.: 632,801
[22] Filed: Dec. 24, 1990
[51] Int. Cl.$^5$ ............................................. H03B 9/00
[52] U.S. Cl. ...................................... 331/88; 331/175
[58] Field of Search ........................... 331/74, 88, 175

[56] References Cited

U.S. PATENT DOCUMENTS

| | | | |
|---|---|---|---|
| 2,820,197 | 1/1958 | Donal | 331/88 X |
| 4,162,459 | 7/1979 | Scharfman | 331/88 X |
| 4,843,347 | 6/1989 | Sigmon et al. | 331/88 |
| 4,961,058 | 10/1990 | Sigmon | 331/88 X |

*Primary Examiner*—Robert J. Pascal
*Attorney, Agent, or Firm*—Frank J. Bogacz

[57] ABSTRACT

A dielectric resonator feed back stabilizer comprising a circulator, 3-dB, 90° hybrid dielectric resonator, and isolator. The circulator provides an input electromagnetic signal from a source to the hybrid, which splits the input signal into two outputs with 90° relative phase difference. One hybrid output is to the load and the other is to a dielectric resonator with high Q. The dielectric resonator reflects a portion of the input signal corresponding to the dielectric resonator operating frequency back to the hybrid which splits the reflected signal into two outputs 90 degree relative phase difference. The first signal reflected back through the hybrid, 180 degrees out of phase with the hybrid input signal from the circulator, is cancelled by superposition with the hybrid input signal. The second reflected signal travels through an isolator to the circulator injection locks the source input signal.

20 Claims, 1 Drawing Sheet

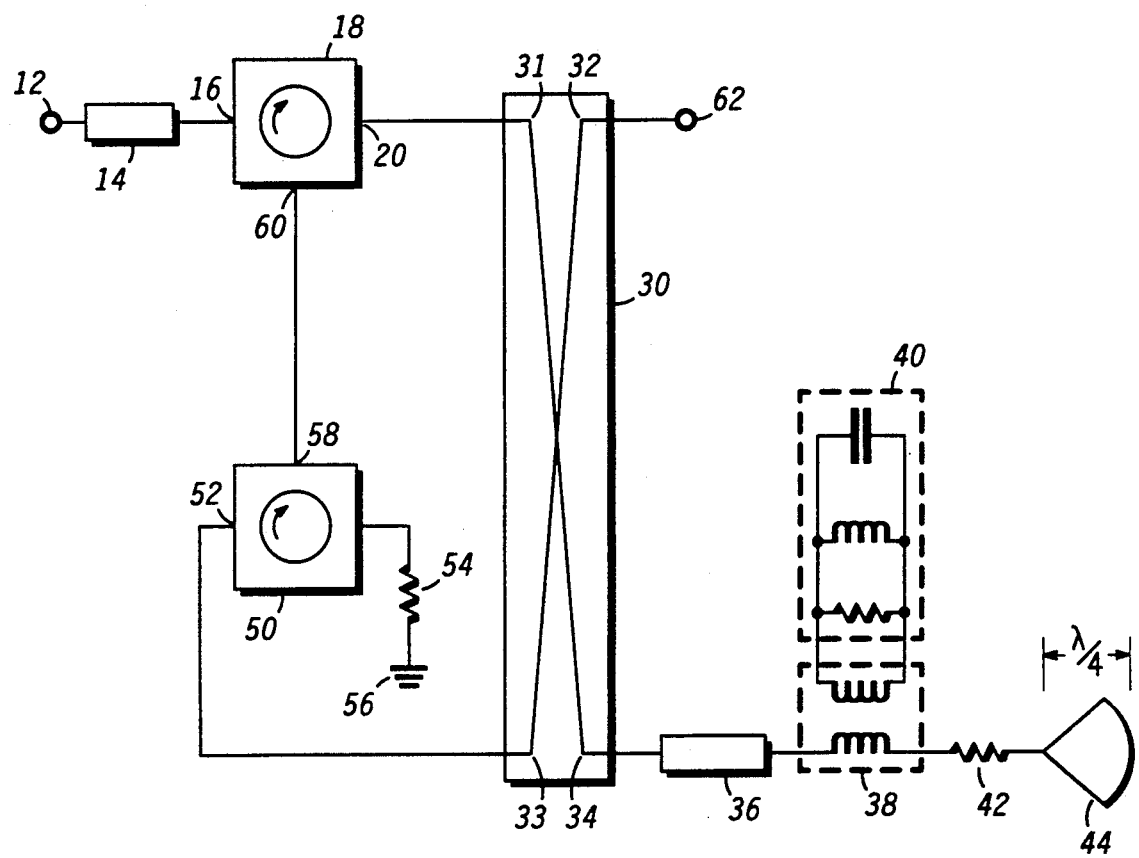

DIELECTRIC RESONATOR FEED BACK STABILIZER

BACKGROUND OF THE INVENTION

This invention relates in general to the field of electromagnetic signal generating sources, in particular to frequency stabilization of sources, and, more particularly, to passive frequency stabilization of high power microwave sources.

Frequency stabilization of sources is important for many electronic products which require highly stable free-running oscillators. Microwave signal generating sources in particular, such as the magnetron, suffer from lack of frequency stability due to temperature and pulse repetition frequency (PRF) changes. For high power microwave applications, e.g. 0.5 kiloWatts (0.5 kW) and above, it has been especially uneconomical and impractical to provide for frequency stabilization.

Techniques for frequency stabilization generally utilize high Q cavity stabilization, phase locked loops, or injection locking. High Q cavity stabilization is typically very expensive and difficult to implement due to the size and complexity of required microwave cavities. Such cavities generally also have an inherent insertion loss resulting in an undesirable reduction in power. Phase locked loops represent the most costly and technically complex method, and involve the greatest number of components and highest area requirements. Injection locking can tend to be complex and expensive because of size requirements, and requires power consumption. A stable active source to provide a frequency reference is also typically required. A significant drawback of injection locking has been a limitation on the radio frequency (RF) output power to be injection phase locked. Generally, only expensive apparatus such as a large number of power field effect transistors (FETs) have been available to provide the injection locking reference source for high power injection locking.

Thus, what is needed is a practical, economical method for frequency stabilization of high power electromagnetic sources, particularly microwave generating sources, with the method preferably employing passive means.

SUMMARY OF THE INVENTION

Accordingly, it is an advantage of the present invention to provide a new and improved apparatus for passively stabilizing a signal generating source. It is a further advantage of the present invention to provide a method to passively stabilize a signal generating source. It is still a further advantage of the present invention to provide apparatus for stabilizing a signal generating source which is economical and suitable for high power applications.

To achieve these advantages, a three deciBel (3 dB), ninety-degree (90°) hybrid dielectric resonator feed back stabilizer is contemplated which includes a circulator, 3-dB, 90° hybrid, dielectric resonator, and isolator. The circulator provides an input electromagnetic signal from a source to the hybrid, which splits the input signal into two half-power outputs with 90° relative phase difference. One hybrid output is to the load and the other is to a dielectric resonator with a high Q. The dielectric resonator reflects a portion of the input signal corresponding to the dielectric resonator operating frequency back to the hybrid, a symmetric device, which splits the half-power reflected signal into two outputs equal in power, again of 90 degree relative phase difference. The first reflected signal back through the hybrid, which is 180 degrees out of phase with the hybrid input signal from the circulator is cancelled by superposition with the hybrid input signal. The other reflected signal travels through an isolator to the circulator, and injection locks the source input signal.

The above and other features and advantages of the present invention will be better understood from the following detailed description taken in conjunction with the accompanying drawings.

BRIEF DESCRIPTION OF THE DRAWING

In the single sheet of drawings, there is shown a circuit schematic of the preferred embodiment of the invention.

DETAILED DESCRIPTION OF THE PREFERRED EMBODIMENT

In the single sheet of drawings, there is shown a dielectric resonator feed back stabilizer 10 which includes a circulator 18, 3-dB, 90° hybrid 30, dielectric resonator 40, and isolator 50. The circulator 18 consists of three ports 16, 20, and 60. An input signal 12 enters a transmission line 14 adjusted for the proper phase presented to the source to be stabilized by the injection locking signal. The signal exits transmission line 14 and enters the circulator 18 at the first circulator port 16. The output port 20 from the circulator 18 serves as the input to the hybrid 30.

The hybrid 30 consists of four ports, 31, 32, 33, and 34. Port 20 of the circulator is connected to port 31 of the hybrid. Hybrid output port 32 is connected to the load and hybrid output port 34 is connected to a microstrip transmission line 36. Microstrip transmission line 36 is coupled electromagnetically to a dielectric resonator 40 by lumped circuit equivalence element 38. The lumped circuit equivalence element 38 is also connected to a resistive element 42, which is tied to a quarter-wavelength microstrip element 44.

Port 33 of the hybrid 30 is connected to an input port 52 of a three-port isolator 50. Port 58 of the isolator 50 is also connected to circulator port 60. The remaining isolator connection is through a resistive element 54 to ground 56.

In operation, an external source provides an electromagnetic input signal at port 12. The input signal enters the transmission line 14, which conducts the input signal to circulator 18 at the first circulator port 16. Circulator port 16 functions by routing signals input to it in the sense of the arrow shown in the single sheet of drawings. Thus, for the input signal at port 16, the circulator 18 provides an output at port 20 of the same signal, minus a signal loss of approximately 0.5 dB across the junction of port 16 and port 20.

The hybrid 30 splits the signal input at port 31 into two half-power outputs at port 32 and port 34 with 90° relative phase difference. The output signal at port 62 goes to the load. The dielectric resonator 40, coupled to the transmission line 36 by lumped circuit equivalence element 38, is made of low-loss dielectric material in the preferred embodiment, exhibiting both a high dielectric constant, e.g., 28, and a high Q, e.g., 10,000. The dielectric resonator 40 has small physical dimensions, e.g. on the order of a tenth of an inch in height and several tenths of an inch in diameter.

The dielectric resonator 40 resonates over a very narrow frequency range centered on an operating frequency, $f_o$. The close coupling of dielectric resonator 40 and lumped circuit equivalence element 38 result in the ability of each to transfer electromagnetic energy to the other. For a spectrum of signals of varying frequency encompassing $f_o$ travelling within lumped circuit equivalence element 38, dielectric resonator 40 will resonate at $f_o$. At $f_o$, the dielectric resonator 40 appears as a high Q open circuit which reflects the incident energy back into port 34 of the hybrid. The remainder of the signal path past lumped circuit equivalence element 38 includes resistive element 42 and a conductive element 44 one-quarter wavelength in length. Conductive element 44 places an AC short at one end of resistive element 42. Resistive element 42 dissipates off-resonance energy not reflected by element 40.

The signal reflected back into port 34 of the hybrid 30, a symmetric device, is split into two outputs equal in power, again of 90 degree relative phase difference at hybrid port 31 and port 33. The first reflected signal back through the hybrid at port 31, which is 180 degrees out of phase with the hybrid input signal from the circulator 18, is cancelled by superposition with the hybrid input signal. The second reflected signal incident at port 33 travels to the input 52 of isolator 50. The isolator 50 functions by routing signals input to it in the sense of the arrow shown in the single sheet of drawings. Thus, for the input signal at port 52, the isolator 50 provides output at port 58 of that same signal, minus a signal loss of approximately 0.5 dB across the junction of port 52 and port 58.

The isolator 50 is a one-way device which allows the second reflected signal from the dielectric resonator 40 to be fed back via port 58 and port 60 to the original signal source in the circulator 18. The isolator 50 prevents any signal from the source to be stabilized to influence the second reflected signal from the dielectric resonator 40 by routing any input to the isolator 50 from the source to be stabilized via port 60 and port 58 through resistive element 54 to ground 56. Thus, the second reflected signal from the dielectric resonator 40 enters the circulator 18 and injection locks the source to be stabilized.

Thus, a three dB, ninety-degree hybrid dielectric resonator feed back stabilizer has been described which overcomes specific problems and accomplishes certain advantages relative to prior art methods and mechanisms. The improvements over known technology are significant. The expense, complexities, and high insertion losses associated with high Q cavity stabilization are avoided. Similarly, phase locked loops, which represent the most costly and technically complex method of frequency stabilization, and which involve the greatest number of components and highest area requirements are not required. Injection locking, which often can be complex, is implemented in a simple configuration which avoids the need for an active reference source (the generating signal source locks itself). The use of an isolated reflected signal from a dielectric resonator as a passive means for providing the stable injection source is a simple, economical method for frequency stabilization at even high power levels, such as for the magnetron above 0.5 kW.

Thus, there has also been provided, in accordance with an embodiment of the invention, a three dB, ninety-degree hybrid dielectric resonator feed back stabilizer that fully satisfies the aims and advantages set forth above. While the invention has been described in conjunction with a specific embodiment, many alternatives, modifications, and variations will be apparent to those of ordinary skill in the art in light of the foregoing description. Accordingly, the invention is intended to embrace all such alternatives, modifications, and variations as fall within the spirit and broad scope of the appended claims.

I claim:

1. A method for stabilizing an electromagnetic signal generating source with a passive stabilizer comprising the steps of:
   providing an electromagnetic input signal to the stabilizer;
   processing the input signal into a plurality of output signals using a three deciBel (3 dB), ninety-degree (90°) hybrid;
   coupling at least one output signal to a resonator to produce a reflected signal; and
   injection locking the signal generating source with the reflected signal.

2. A method of stabilizing an electromagnetic signal generating source with a passive stabilizer as in claim 1 wherein the step of providing an electromagnetic signal input to the stabilizer comprises the steps of:
   circulating the electromagnetic signal in a circulator of three ports;
   inputting the electromagnetic signal generating source to the first port of the circulator;
   transmitting the electromagnetic signal from the second port of the circulator to a electromagnetic signal processor; and
   feeding back the reflected signal to the third port of the circulator.

3. A method of stabilizing an electromagnetic signal generating source with a passive stabilizer as in claim 2 wherein the step of injection locking the generating source with the reflected signal comprises the steps of:
   providing a dielectric resonator as the resonator producing the reflected signal;
   inputting the reflected signal of the dielectric resonator to a second port of the hybrid;
   producing first and second reflected signal outputs from the hybrid at third and fourth hybrid ports from the reflected signal input;
   isolating the first reflected signal output from the hybrid; and
   providing the isolated first reflected signal output as a stable reference source to injection lock the generating source.

4. A method of stabilizing an electromagnetic signal generating source with a passive stabilizer as in claim 3 wherein the step of isolating the first reflected signal from the hybrid comprises the steps of:
   transmitting an isolator input signal from the fourth port of the hybrid to a first isolator port;
   transmitting an isolator feed back signal from a second port of the isolator to the third port of the circulator; and
   transmitting a circulator input to the second port of the isolator through a third isolator port, through a resistor to ground.

5. A method of stabilizing an electromagnetic signal generating source with a passive stabilizer as in claim 2 wherein the step of processing the input signal into a plurality of output signals includes the step of processing the input signal using a three deciBel (3 dB), ninety-degree (90°) hybrid.

6. A method of stabilizing an electromagnetic signal generating source with a passive stabilizer as in claim 5 wherein the step of injection locking the generating source with the reflected signal comprises the steps of:
  providing a dielectric resonator as the resonator producing the reflected signal;
  inputting the reflected signal of the dielectric resonator to a second port of the hybrid;
  producing first and second reflected signal outputs from the hybrid at the third and fourth hybrid ports from the reflected signal input;
  isolating the first reflected signal output from hybrid; and
  providing the isolated reflected signal output as a stable reference source to injection lock the generating source.

7. A method of stabilizing an electromagnetic signal generating source with a passive stabilizer as in claim 6 wherein the step of isolating the first reflected signal from the hybrid comprises the steps of:
  transmitting an isolator input signal from the fourth port of the hybrid to a first isolator port;
  transmitting an isolator feed back signal from a second port of the isolator to the third port of the circulator; and
  transmitting a circulator input to the second port of the isolator through a third isolator port, through a resistor to ground.

8. A passive stabilizer for use with an electromagnetic signal generating source comprising:
  circulating means including a first port coupled to the electromagnetic signal generating source, a second port, and a third port;
  signal processing means including a first port connected to the second port of the circulating means, a second port, a third port, and a fourth port coupled to the third port of the circulating means;
  a load, coupled to the second port of the signal processing means; and
  resonating means, coupled to the third port of the signal processing means, which produces the injection locking signal.

9. A passive stabilizer for use with an electromagnetic signal generating source as claimed in claim 8 wherein the signal processing means is a three-deciBel (3 dB), ninety-degree (90°) hybrid.

10. A passive stabilizer for use with an electromagnetic signal generating source as claimed in claim 8 wherein the resonating means comprises:
  transmission line means including transforming means connected to the third port of the signal processing means; and
  a dielectric resonator coupled to the transmission line including transforming means.

11. A passive stabilizer for use with an electromagnetic signal generating source as claimed in claim 10 wherein the transmission line including transforming means is further connected to a conductive segment one-quarter wavelength in length at the operating frequency.

12. A passive stabilizer for use with an electromagnetic signal generating source as claimed in claim 10 wherein the fourth port of the signal processing means is coupled to the third port of the circulating means through an isolating means.

13. A passive stabilizer for use with an electromagnetic signal generating source as claimed in claim 12 wherein the isolating means comprises:
  first isolating means port connected to the fourth port of the signal processing means to allow an isolating means input signal to enter the isolator;
  second isolating means port connected to the third port of the circulating means to allow an isolating means feed back signal to enter the circulator; and
  a third isolator port connected through a resistive means to ground to isolate a circulator input to the second port of the isolator from the dielectric resonator.

14. A passive stabilizer for use with an electromagnetic signal generating source as claimed in claim 10 wherein the signal processing means comprises a three-deciBel (3 dB), ninety-degree (90°) hybrid.

15. A passive stabilizer for use with an electromagnetic signal generating source as claimed in claim 14 wherein the fourth port of the signal processing means is coupled to the third port of the circulating means through an isolating means.

16. A passive stabilizer for use with an electromagnetic signal generating source as claimed in claim 15 wherein the isolating means comprises:
  first isolating means port connected to the fourth port of the signal processing means to allow an isolating means input signal to enter the isolator;
  second isolating means port connected to the third port of the circulating means to allow an isolating means feed back signal to enter the circulator; and
  a third isolator port connected through a resistive means to ground to isolate a circulator input to the second port of the isolator from the dielectric resonator.

17. A method for stabilizing an electromagnetic signal generating source comprising the steps of:
  providing an input electromagnetic signal to a circulator;
  coupling the output signal of the circulator to a first port of a 3 dB, 90° hybrid of four ports;
  providing an output from the second port of the hybrid to a load;
  connecting the third port of the hybrid to a resonator;
  reflecting resonator power to the fourth hybrid port;
  producing a first hybrid reflected signal and a second hybrid reflected signal from the reflected resonator power input;
  isolating the first hybrid reflected signal;
  feeding back the second hybrid reflected signal to the circulator; and
  injection locking the input electromagnetic signal with the second hybrid reflected output.

18. A method of stabilizing an electromagnetic signal generating source with a passive stabilizer as in claim 17 wherein the step of providing an electromagnetic signal input to the stabilizer comprises the steps of:
  circulating the electromagnetic signal in a circulator of three ports;
  inputting the electromagnetic signal generating source to the first port of the circulator;
  transmitting the electromagnetic signal from the second port of the circulator to a electromagnetic signal processor; and
  feeding back the reflected signal to the third port of the circulator.

19. A method of stabilizing an electromagnetic signal generating source with a passive stabilizer as in claim 18 wherein the step of injection locking the generating source with the second reflected signal comprises the step of providing a dielectric resonator as the resonator.

20. A method of stabilizing an electromagnetic signal generating source with a passive stabilizer as in claim 19, wherein the step of isolating the first reflected signal from the hybrid comprises the steps of:

transmitting an isolator input signal from the fourth port of the hybrid to a first isolator port;

transmitting an isolator feed back signal from a second port of the isolator to the third port of the circulator; and transmitting a circulator input to the second port of the isolator through a third isolator port, through a resistor to ground.

* * * * *